United States Patent

Suzuki

[11] Patent Number: 5,973,401
[45] Date of Patent: Oct. 26, 1999

[54] SEMICONDUCTOR DEVICE ENABLING TEMPERATURE CONTROL IN THE CHIP THEREOF

[75] Inventor: Seigo Suzuki, Tokyo-to, Japan

[73] Assignee: Kabushiki Kaisha Toshiba, Kawasaki, Japan

[21] Appl. No.: 08/892,203

[22] Filed: Jul. 14, 1997

Related U.S. Application Data

[63] Continuation of application No. 08/632,141, Apr. 15, 1996, abandoned, which is a continuation of application No. 08/393,034, Feb. 23, 1995, abandoned, which is a continuation of application No. 07/767,463, Sep. 30, 1991, abandoned.

[30] Foreign Application Priority Data

Sep. 28, 1990 [JP] Japan .................. P02-257473
Sep. 28, 1990 [JP] Japan .................. P02-257475
Oct. 1, 1990 [JP] Japan .................. P02-260537

[51] Int. Cl.$^6$ .................................................. H01L 23/48
[52] U.S. Cl. .......................... 257/758; 257/774; 257/758
[58] Field of Search ..................................... 257/758, 773

[56] References Cited

U.S. PATENT DOCUMENTS

| 4,544,941 | 10/1985 | Ariizumi et al. | 257/774 |
| 5,119,170 | 6/1992 | Iwamatsu | 257/773 |
| 5,124,781 | 6/1992 | Tashiro | 257/759 |
| 5,416,355 | 5/1995 | Kudoh | 257/758 |

*Primary Examiner*—Mark V. Prenty
*Attorney, Agent, or Firm*—Oblon, Spivak, McClelland, Maier & Neustadt, P.C.

[57] ABSTRACT

Disclosed are semiconductor devices employing chips comprising highly integrating semiconductor elements, and having various means for controlling temperature increase of the chips. These means comprise three approaches: means for controlling heat generation by adjusting clock frequencies to be supplied to the chips respectively; means for suppressing heat generation by suitably arranging the wiring construction of the chip substrate; and means for suppressing heat generation of sub-chips by a prarallel process such as optical communication between the sub-chips.

1 Claim, 16 Drawing Sheets

SEMICONDUCTOR DEVICE ENABLING TEMPERATURE CONTROL IN THE CHIP THEREOF

This is a continuation of application Ser. No. 08/632,141, filed on Apr. 15, 1996, now abandoned, which is a continuation of application Ser. No. 08/393,034, filed on Feb. 23, 1995 now abandoned, which is a continuation of application Ser. No. 07/767,463, filed Sep. 30, 1991 now abandoned.

BACKGROUND OF THE INVENTION

1. Field of the Invention

The present invention relates to a semiconductor device including several means for suppressing and controlling a temperature increase caused by excessive consumption of electric power in the integrating semiconductor devices below the allowable maximum temperature with less sacrifice of performance.

2. Description of the Prior Art

Generally, power consumption generated from one semiconductor element is far less than that from one electronic tube and the like device. Accordingly, in a case of semiconductor devices of relatively small integration, heat generation or temperature increase caused by operation of such devices is usually small. Therefore, it is not necessary to provide such devices with special means for temperature control.

Moreover, with the recent increase of the integration degree in semiconductor devices such as LSI, IC, the power consumption per one semiconductor element has been greatly reduced, and such tendency will be more remarkable. To the contrary, the power consumption per unit area of highly integrated semiconductor devices is increased because the number of semiconductor elements included in the devices is remarkably increased in spite of reduction in size of the devices.

Particularly, fine-processing technology for producing memory devices is now well advanced. Therefore, the memory capacity has been rapidly increased from 1M bits to 64M bits. Moreover, the elevation of the integration degree of such memory devices is eagerly required and studied in the semiconductor field.

Accordingly, it is necessary and will be more necessary to provide semiconductor devices with special means for controlling temperature increase due to the improvement of the integrated density. By the way, power consumption Pw per unit time to be generated in a semiconductor device can be generally expressed by the following formula:

$$Pw = K \cdot C \cdot V^2 \cdot fc \qquad (1)$$

where V is operating voltage, fc is a driving clock frequency, C is total capacitance of the semiconductor device, and K is a constant number under a condition that the capacitance C is fully charged and discaharged.

The operating voltage V, in the equation (1), is ordinarily determined in advance due to a property of a semiconductor element to be used. Therefore, it is very difficult to change the supplied voltage to the semiconductor device from the outside during the operation thereof.

Accordingly, such a method of changing the operating voltage V during the operation has actually never been tried so far.

Hereinafter, a conventional technology will be explained from three points of view.

Firstly, a method concerning the clock frequency will be explained. In a conventional technology, a clock frequency is so selected as to be constant and to restrain the temperature increase of a semiconductor device within an allowable range. Then, a constant and lower clock frequency fc is adopted for operating during all operating period.

According to such a method, however, it is difficult to sufficiently utilize operational characteristics corresponding to a high-frequency range or correctly execute high-speed operation or process, in some specific parts of the semiconductor device.

Secondly, a method concerning the total capacitance C of each semiconductor will be described as follows.

Generally, the capacitance of a semiconductor device such as a LSI consists of capacitance in the semiconductor elements and capacitance in the parasitic capacitance.

For example, in a MOS element, the element capacitance consists of the MOS capacitance and the junction capacitance. In this case, the element capacitance per one semiconductor element is reduced with an increase of the integration. However, since the number of the elements per one semiconductor device is increased at the same time, the total element capacitance is not greatly changed by the increase of integration.

On the other hand, the parasitic capacitance is so-called stray capacitance in the wiring portion, and consists of capacitance generated between adjacent wiring lines and capacitance generated between each wiring line and the substrate.

When the integration degree of a semiconductor is increased, the width of each wiring line is narrowed in inverse proportion to the increase of the number of wiring lines. Therefore, the total area of the portions where the wiring lines face to the substrate is not changed so much. Moreover the thickness of the insulating layer is decided regardless of the integration density. Accordingly, the capacitance generated between the wiring lines and the substrate is not changed by the change in integration density.

On the other hand, since the distance between the wiring lines is decreased as the integration density increases, the capacitance between each adjacent pair of the wiring lines is increased in inverse proportion to the decrease of the wiring distance.

However, at the level of the integration density based on the conventional semiconductor technology, the line-to-line capacity as well as the line-to-substrate capacity was not so large as to be seriously questioned. However, it becomes necessary to solve the problem on power consumption caused by the recent extreme increase of the line-to-line capacity with elevation of the integration density.

Lastly, a conventional technique concerning parallel processing will be stated as follows.

A parallel processing has been used for mainly increasing the processing speed by processing a plural of units in parallel instead of processing one large complicated machine. In the conventional technique, communication between parallel elements such as parallel processors is executed by wiring system, since wiring lines for communication between the elements are comparatively few.

However, power consumption in a semiconductor device has rapidly increased and temperature rising in the device excess the limit temperature by recent progress in integration density of semiconductor elements. In order to solve the above thermal problem and speed up the processing of the device, the parallel elements are divided into smaller elements and increased in number.

Then, new problems of parallel processing software and communication speed between the elements have arisen. With respect to the problem on the parallel processing software, the possibility of improvement still remains. However, it is very difficult to solve the problem on the communication between parallel elements because the communication speed is still left as a fatal problem. Accordingly, it is very difficult to realize high speed communication by a parallel processor in the conventional wiring system.

As stated above, the power consumption of the semiconductor devices is extremely enlarged because of the increase of the integration degree in semiconductor devices achieved by the advance of fine-processing technology to the devices or of the increase of the operating frequency such as clock frequency fc caused by demand of improving the processing speed and the operating characteristics.

Moreover, the circuit construction of semiconductor devices becomes very complicated with an increase of the integration. Accordingly, the conventional semiconductor devices are likely to be in an abnormal state or get in trouble.

SUMMARY OF THE INVENTION

The present invention was made to solve the above-mentioned problems.

Therefore, it is an object of the present invention to provide a semiconductor device which is highly integrated and excellent in the heat discharging property, and particularly to provide a semiconductor device which can control temperature increase in the chip thereof.

To achieve this object, the present invention provides three kinds of means which are related to one another for solving the above-mentioned problems. Namely, these three kinds of means for solving the problem are (a) means for controlling the clock frequency, (b) means for reducing the total capacitance and (c) means for reducing power consumption of each block by executing the parallel processing.

In the equation (1), if fc varies in time, the power consumption Pw can be expressed as followers, $$Pw = K \cdot C \cdot V^2 \int_0^T fc(t)dt, \quad (2)$$

or $$Pw = K \cdot C \cdot v^2 \cdot \Sigma(fci \cdot \Delta ti), \Sigma\Delta ti <= T, \quad (3)$$

where T is a length of the term, and fci is constant frequency in the term $\Delta ti$ and equals zero (fci=0) during the term (T–$\Sigma\Delta ti$).

Considering the equations (2) and (3), the first means for controlling the clock frequency is classified into two kinds of means: a means for generating a clock signal of a predetermined frequency and controlling suppling periods of the clock signal to a semiconductor device, and a means for generating a plurality of clock signals of different frequencies and suppling one of the clock signals to each block of the semiconductor device for a predetermined period.

By the equations (2) and (3), the power consumption Pw in the semiconductor device can be optionally controlled by either adjusting supplying period or adjusting the frequency of the clock signal to be supplied thereto. Therefore, two kinds of means are presented as the means for controlling the clock frequency in the present invention.

According to the first kind of means of the present invention, the temperature in the chip of a semiconductor device can be controlled within a predetermined temperature range and the power consumption can be reduced thereby. The second kind of the means ,as well as the first one, can control the temperature and reduce the power consumption.

The first one is especially effective in a sequential processing, while the second one is effective in a parallel processing.

The applying clock frequency fc can be freely controlled from the outside within the following range:

fmin<fc<fmax, where fmin is 0 (in case of d.c.) to 0.1 KHz and fmax is, though changed by the size of the chip, specifically 30 to 500 MHz in case of an LSI chip for high-speed operation whose power consumption Pw has been studied so far.

Namely, the controllable range of fc is 0 to 500 MHz at the maximum and 0.1KHz to 30 MHz at the minimum. Moreover, according to the equation (1), the power consumption Pw is almost in proportion to fc. Therefore, Pw can be controlled so widely as in case of fc.

Namely, according to the present invention, it becomes possible to suppress temperature increase of semiconductor chips in the device by reducing the power consumption thereof by changing the frequency of a clock signal during the time intervals. Moreover, as compared with conventional semiconductor devices where a clock signal of a constant frequency is given, it also becomes possible to greatly reduce the power consumption of a semiconductor device comprising a plurality of blocks by supplying a clock signal of a specific frequency to each block.

Moreover, the present invention provides means, as will be described below, for solving the problem in reducing the total capacitance of a semiconductor device.

Namely, the means relates to wiring construction in a semiconductor device which is so finely processed that the gate length is less than the thickness of the insulating layer. More specifically, the wiring construction is characterized in that the minimum interval (P) between the wiring lines is less than the thickness (Q) of the insulating layer, and the minimum width (A) of the wiring lines is less than a half of the minimum wiring-line interval. Namely, the above relations are expressed as follows:

2·A≦P≦Q.

If these relations concerning the respective sites in the wiring construction are satisfied, the wiring capacitance consisting of the line-to-substrate capacitance and the line-to-line capacitance can be decreased. Accordingly, it becomes possible to reduce the power consumption of highly integrated semiconductor devices much more than the conventional methods.

As mentioned above, this means can minimize the wiring capacitance by setting the wiring line interval at a suitable range. Therefore, it is possible to effectively reduce the power consumption of a semiconductor device.

Moreover, the present invention also provides a means for executing the parallel processing of a semiconductor device comprising a plurality of semiconductor chips. This means is characterized in that a light-emitting element and a light-receiving element are incorporated to face each other in a package of each semiconductor chip so as to realize circuit connection between the semiconductor chips.

Namely, since the so-called photo-switching technology is introduced into semiconductor devices by this means, the power consumption can be greatly reduced and high-speed operation becomes possible.

Moreover, since the photo-switching can be carried out through each chip package in a semiconductor device, the block operation can be easily realized. Therefore, the power consumption in each block can be reduced so much and the heat-discharging can be also enhanced.

These and other objects, features and advantages of the present invention will be more apparent from the following description of a preferred embodiment taken in conjunction with the accompanying drawings.

DETAILED DESCRIPTION OF THE EMBODIMENTS

Described below is an embodiment of the present invention where a synchronizing clock frequency is controlled based on time.

In more detail, this embodiment is so constructed as to suppress temperature increase of a semiconductor chip within a predetermined range by controlling a synchronizing clock frequency fc based on time.

In case of a semiconductor device for executing high-speed operation, the power consumption Pw of the chip is so large that generated heat breaks down the semiconductor chip at a high temperature. Incidentally, the temperature of the chip increases in inverse proportion to thermal capacity of the chip body and in proportion to thermal resistance of the package.

Figure 1:
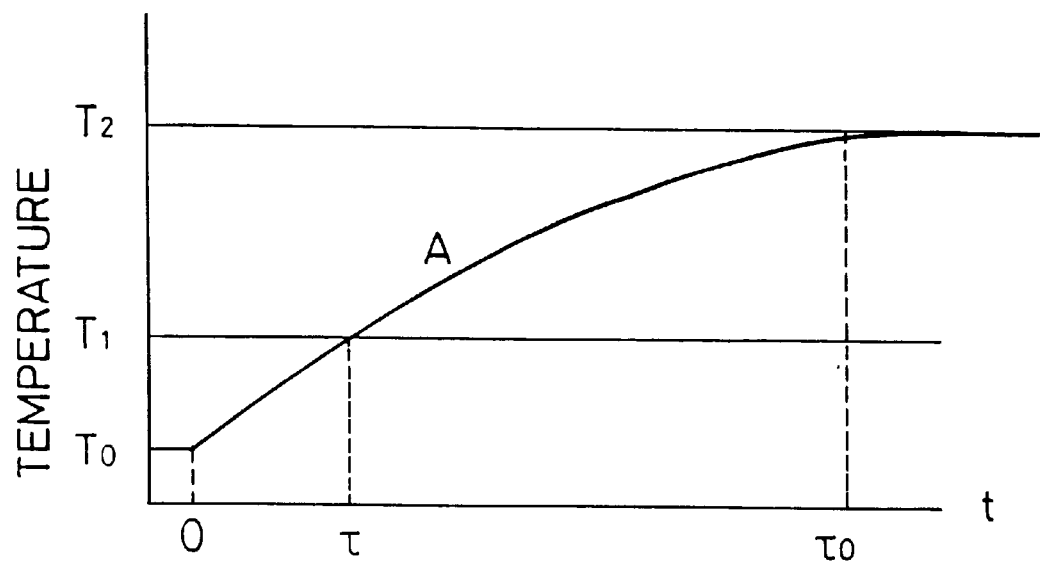
FIG. 1 shows a curve of virtual junction temperature in a chip.

FIG. 1 shows a relation between time and temperature Tj at a junction portion of a chip which is operated by a predetermined frequency. In the same drawing, the vertical axis shows the junction temperature Tj and the horizontal axis shows time t, moreover, $T_1$ is a limit allowable temperature and $T_2$ is a finally-reached temperature.

Namely, the junction temperature Tj of the chip far exceeds the temperature $T_1$ as shown in the curve A of FIG. 1, and then reaches the temperature $T_2$. Ordinarily, the temperature $T_1$ is about 150° C. Moreover, in the case of usual LSI's, the junction temperature Tj reaches $T_2$ within several tens milliseconds to several hundreds milliseconds.

Namely, when a semiconductor device such as a high-speed processor is operated with a predetermined clock frequency fc, the junction temperature generates a similar curve to the curve A of FIG. 1 from T1 to T2. Incidentally, if the junction temperature is excessively increased in such a manner, the reliability of the chip is likely to be deteriorated.

Therefore, the aim of this embodiment is to reduce the frequency just before the junction temperature Tj reaches the limit temperature T1 which is so set as to sufficiently maintain the chip reliability during operation.

Thereafter, if the junction temperature Tj is reduced to a predetermined temperature, the frequency is increased to a suitable value, then, the value is maintained until the chip temperature reaches T1. Namely, by repeating such an operation, it is possible to effectively prevent the junction temperature Tj from exceeding the limit temperature T1.

Figure 2:
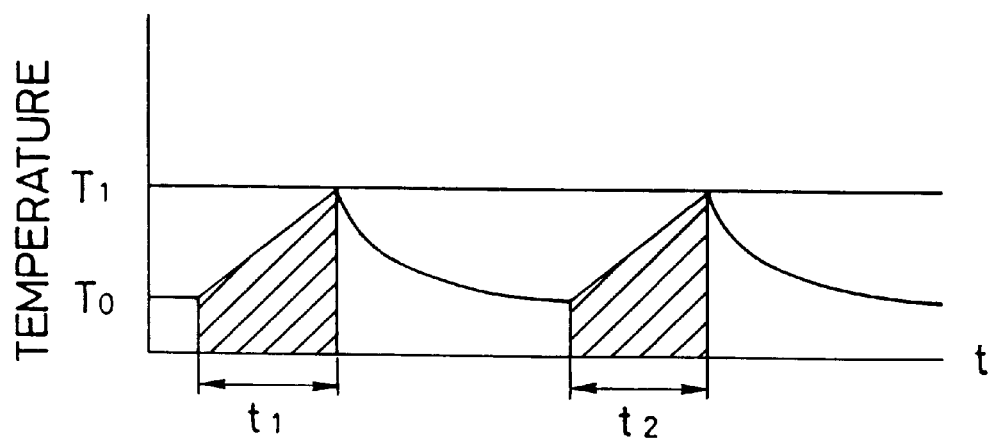
FIG. 2 shows how virtual junction temperature changes in a chip where the clock frequency is controlled.
Figure 3:
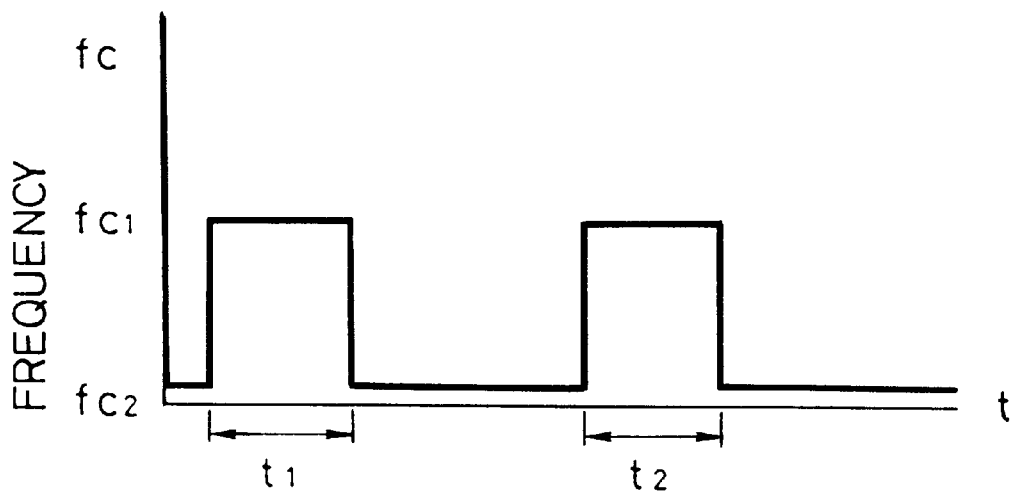
FIG. 3 shows a relation between a controlled clock frequency and time.

FIGS. 2 and 3 respectively show a specific example of the above-mentioned operation. When a clock frequency fc1 is given to a chip which has been operated by a clock frequency fc2 as shown in FIG. 3, the chip temperature is increased from T0 to T1 within a time interval of t1. Then, the clock frequency fc is reduced to fc2. After a predetermined time interval, the clock frequency fc is similarly increased from fc2 to fc1. In such a manner, it can be prevented that the junction temperature is excessively increased.

Now, an example of a ceramic standard package in which an LSI chip several millimeters square is contained, is explained. In this case, assume that the time τ required for the junction temperature Tj of this semicondutor device to reach the above-mentioned limit temperature $T_1$ from the temperature $T_0$ is 10 ms. The task to be carried out during the time interval τ by a high-speed processor included in the LSI chip is described next. In this case, a clock frequency used for operating the high-speed processor is fc, and one instruction is executed by one clock at an instruction execution speed $f_1$. Namely, fc is equal to $f_1$ here. Incidentally, the number of total execution steps N is τ×fc.

Accordingly, when τ is 10 ms and fc is 50 MHz, the total execution step number N is given by the following formula:

$$N=10\times10^{-3}\times50\times10^6=5\times10^5.$$

Namely, it is possible to execute instructions of $5\times10^5$ steps.

Next, the maximum allowable loss of the semiconductor chip used in this case is obtained in the following way.

Figure 4:
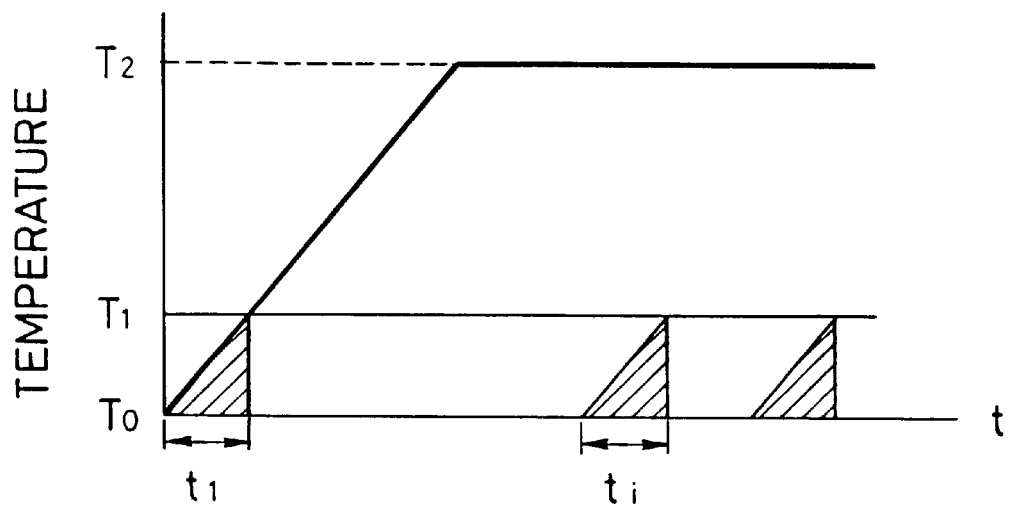
FIG. 4 shows a duty time.

FIG. 4 shows a line approximated to the curve shown in FIG. 1. In the figure, the following expression is established:

$$(T_2-T_0)/(T_1-T_0)=4.$$

In this case, the duty (=Σti) on the time axis is ¼ at the maximum. If it is estimated lower to ⅕, and $T_1$ and $T_0$ are set at 150° C. and 50° C. respectively, $T_2$ becomes 450° C. in accordance with the above expression. Moreover, if the thermal resistance $R0$ (=$\Delta Tj/Pw$) is 5° C./W, and the increment $\Delta Tj$ of the chip junction temperature $T_j$ is 75° C., the power consumption $Pw$ is 15 W at the maximum. Namely, this is the virtual allowable loss.

Moreover, since this value of 15 W is the d.c. power consumption, the peak value of the a.c. power consumption becomes 60 W (15÷¼). In this case, fc1 is equal to the maximum operation frequency and fc2 is set at about 1/10 to 1/100.

An embodiment for controlling blocks arranged in parallel by adjusting each frequency to each block is described below.

Figure 5:
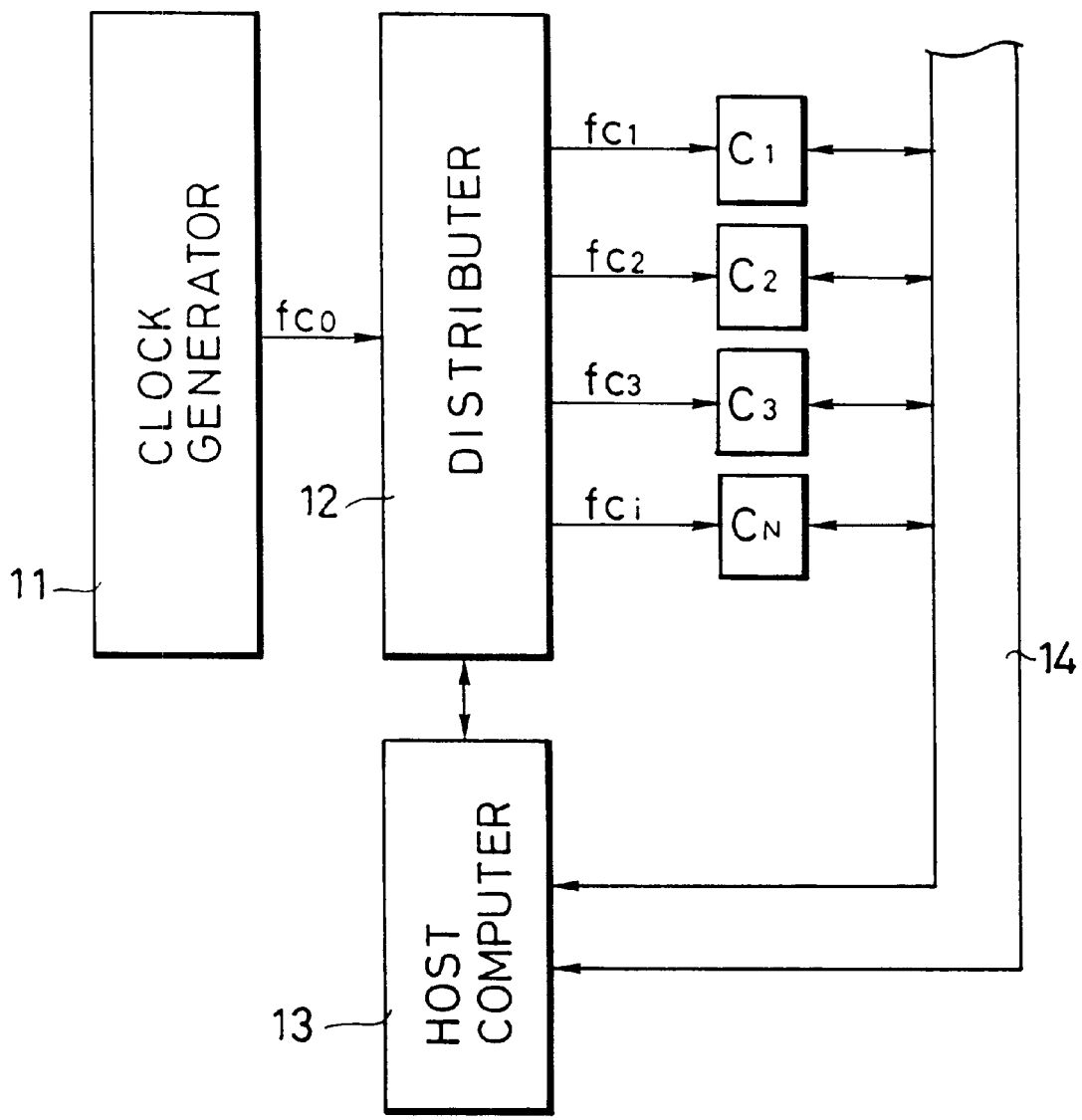
FIG. 5 shows a system for controlling parallel blocks.

FIG. 5 shows a construction of this embodiment. As shown in the figure, a semiconductor device includes a plurality of blocks arranged in parallel.

In this case, the semiconductor device such as a VLSI comprises a plurality of function blocks $C_1$ to $C_N$. Moreover, the operation speed and power consumption of each function block can be controlled by adjusting each clock signal to be supplied thereto, so as to suppress the power consumption so as not to exceed a predetermined limit value.

Besides, giving and receiving data between these blocks are not synchronized with each other, however, these operations may be carried out synchronously by providing a suitable waiting time period.

In FIG. 5, a clock generator 11 is connected to a clock distributer 12, and supplies a first clock signal of frequency $fc_0$ thereto. Then, the distributor 12 generates second clock signals of frequencies $fc_1$ to fci by using, for example, a shift register based on the first clock signal.

Namely, the distributor 12 is connected to the function blocks $C_1$ to $C_N$, and supplies the second clock signals of frquencies $fc_1$, $fc_2$, . . . , $fc_N$ respectively. Moreover, the distributor 12 is also connected to a host computer 13.

Further, the host computer 13 is connected to the respective blocks $C_1$ to $C_N$ through a common bus 14 for giving and receiving data thereto. Furthermore, the distributor 12 is controlled by a control command given from a controller equipped in the host computer 13. The control is dynamically carried out in accordance with the system operation.

In this embodiment, these function blocks $C_1$ to $C_N$ respectively correspond to elements arranged in a parallel processor array.

Moreover, the host computer 13 employed in this embodiment is an RISC processor (Reduced Instruction Set Computer). However, the host computer 13 may be a processor at the microcomputer level.

The operation control is carried out as described below.

First, the host computer 13 classifies and assigns tasks to the respective function blocks $C_1$ to $C_N$, then supplies instructions or data thereto. (Step A)

Then, the host computer 13 investigates mutual relations of the tasks assigned to the respective function blocks $C_1$ to $C_N$ such as the amount of the task, preferential degrees and synchronizing timing, and decides each speed of the clocks $fc_1$ to $fc_N$ to be supplied to $C_1$ to $C_N$. (Step B) Moreover, the host computer 13 transmits a control command for generating these clocks $fc_1$ to $fc_N$ of the function blocks $C_1$ to $C_N$ to the distributor 12. (Step C) Thereafter, the distributor 12 generates the second clock signals of frequencies $fc_1$ to $fc_N$ based on the control command. (Step D)

For example, these clock signals are set as follows:

$fc_0$=20 MHz,
$fc_1$=fco/2=10 MHz,
$fc_2$=fco/16=1.25 MHz,
$fc_3$=fco/256=78.1 KHz, and
$fc_4$=fco/2=10 MHz.

This means that the blocks $C_1$, $C_4$ are busy, and the amount of the task given to the clock $C_3$ is the smallest of all blocks. Namely, in this embodiment, these clock signals are decided based on each amount of the tasks.

Moreover, when the tasks of all the blocks are completed, the operation of the host computer 3 executes a terminating instruction. Or, if a new group of tasks are left, the control returns to the first step A. In this case, the frequencies of the second clock signals $fc_1$ to $fc_N$ are newly decided so that they may be changed from those previously decided. (Step E)

Next, the effect which will be obtained if a processor array comprising 16 pieces of blocks $C_1$, $C_2$, ... $C_{16}$ is used in this embodiment is described below. Assume that the power consumption of each block is 3 W/chip by 10 MHz.

Moreover, all tasks are divided into two groups A and B, and each task belonging to the group A is executed for 120 ms, and each task belonging to the group B is executed for 50 ms. In the task group A, 2 blocks are operated by 10 MHz, 8 blocks by 1 MHz and 6 blocks by 100 KHz.

While, since the power consumption $Pw$ is in proportion to the clock frequency fci, the total of $Pw$ in the task group A (hereinafter designated by $Pwa$) is calculated as follows:

$$Pwa = 3W \times (2 + 8 \times 1/10 + 6 \times 1/10) = 8.58 \text{ W}.$$

While in the task group B, 3 blocks are operated by 10 MHz, 2 blocks by 1 MHz and 11 blocks by 100 KHz. Therefore, the total of the power consumption $Pw$ (hereinafter designated by $Pwb$) is expressed as follows:

$$Pwb = 3W \times (3 + 2 \times 1/10 + 11 \times 1/100) = 9.93 \text{ W}.$$

Moreover, the average time of power consumption in the group A is 120 ms, while it is 50 ms in the group B. Accordingly, the average power consumption in the groups A and B is expressed as follows:

$$8.58 \times 120/(120+50) + 9.93 \times 50/(120+50) = 8.98 \text{ W}.$$

On the other hand, according to the above-mentioned conventional method, the clock of frequency 10 MHz is given to these 16 blocks. Accordingly, the total power consumption is 48 W (3 W×16). Therefore, the virtual power consumption generated by the present invention is far smaller than that of the conventional system and the reduction ratio is about 1/5.35.

Incidentally, the power consumption $Pw$ of the chip is increased with elevation of the integration density. Likewise, the power consumption becomes 10 W/chip if the clock frequency fc is increased from 50 MHz to 100 MHz. Accordingly, the total power consumption of this case where 16 chips are used becomes 160 W. Therefore, the conventional system can not be used under this condition because heat to be generated by the power consumption can not be controlled by the conventional cooling method.

However, according to this embodiment, the total power consumption becomes about 29.9 W (160÷5.35). As the result, it is becomes possible to operate semiconductor devices using highly integrated chips by adopting this embodiment with a compulsory cooling method.

As described above, the host computer assigns each task to each block, however, it is rare that the maximum clock frequency is supplied to all processors. Even if supplied, the supply time is very short (about 100 ms).

Moreover, if the average power consumption between the task groups exceeds a predetermined limit value, the clock frequencies to all processors is reduced to 1/M at the same time, for example, by generating a default mode from the host computer. The 1/M is a default value less than one. Though this default mode is executed by the software of the host computer in this embodiment, it is also possible to execute this mode by the hardware in the distributor.

Namely, according to this embodiment, it becomes possible to suppress the temperature increase of semiconductor devices by reducing the power consumption thereof by changing the frequency of clock signals to be given from the outside at a predetermined time interval.

Moreover, by supplying a clock signal of a specific frequency to each block in a semiconductor device comprising a plurality of blocks, the power consumption can be greatly reduced as compared with conventional semiconductor devices in which the same clock signal is given to all respective blocks included therein.

Figure 6:
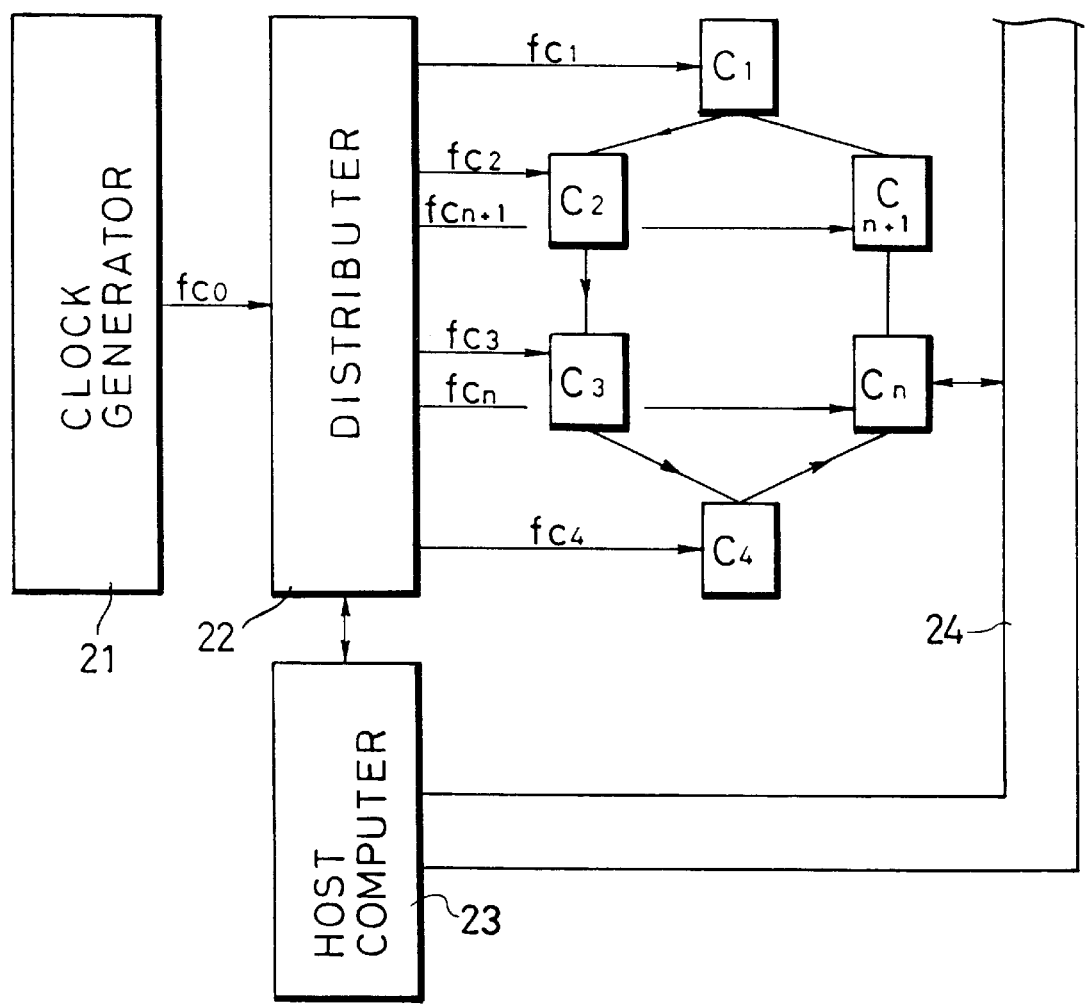
FIG. 6 shows a system for controlling blocks connected in sequence.
Figure 7:
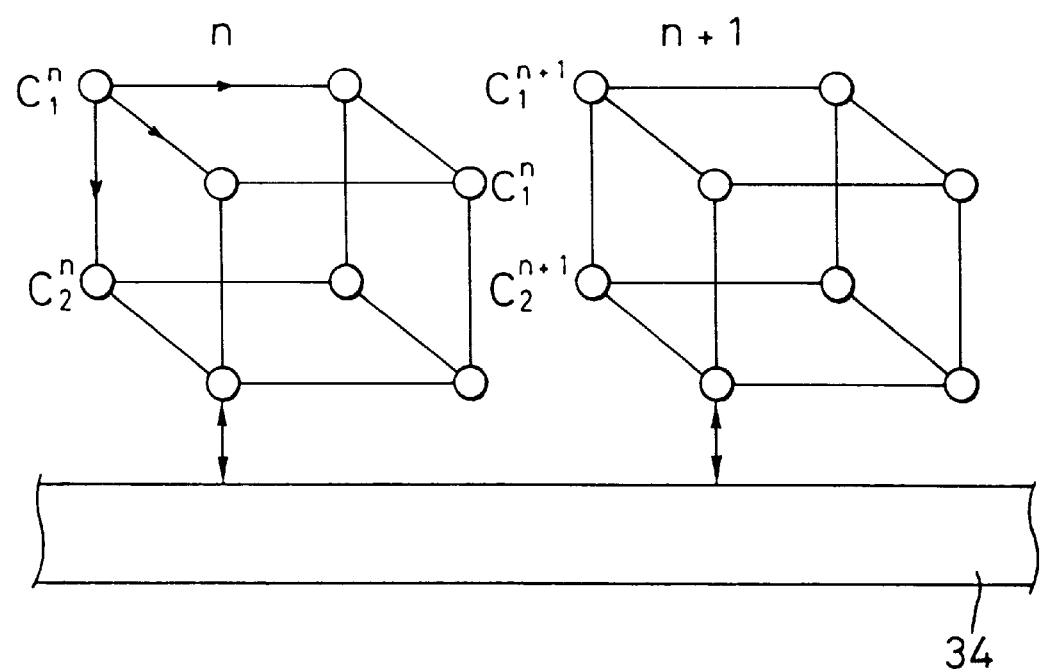
FIG. 7 shows a case where a system for classifying blocks is controlled.

Incidentally, FIGS. 6 and 7 respectively show other two systems for realizing the same cooling effect by a plurality of chips as described above. More specifically, FIG. 6 shows an embodiment in which a plurality of chips $C_1$ to $C_N$ are arranged in sequence, and only the chip $C_N$ gives and receives data to a bus. While, FIG. 7 shows construction for classifying a plurality of chips with respect to data to be transmitted to or from a bus.

Next, another embodiment of the present invention for improving the total capacitance is explained with reference to FIGS. 8 and 9.

Figure 8A:
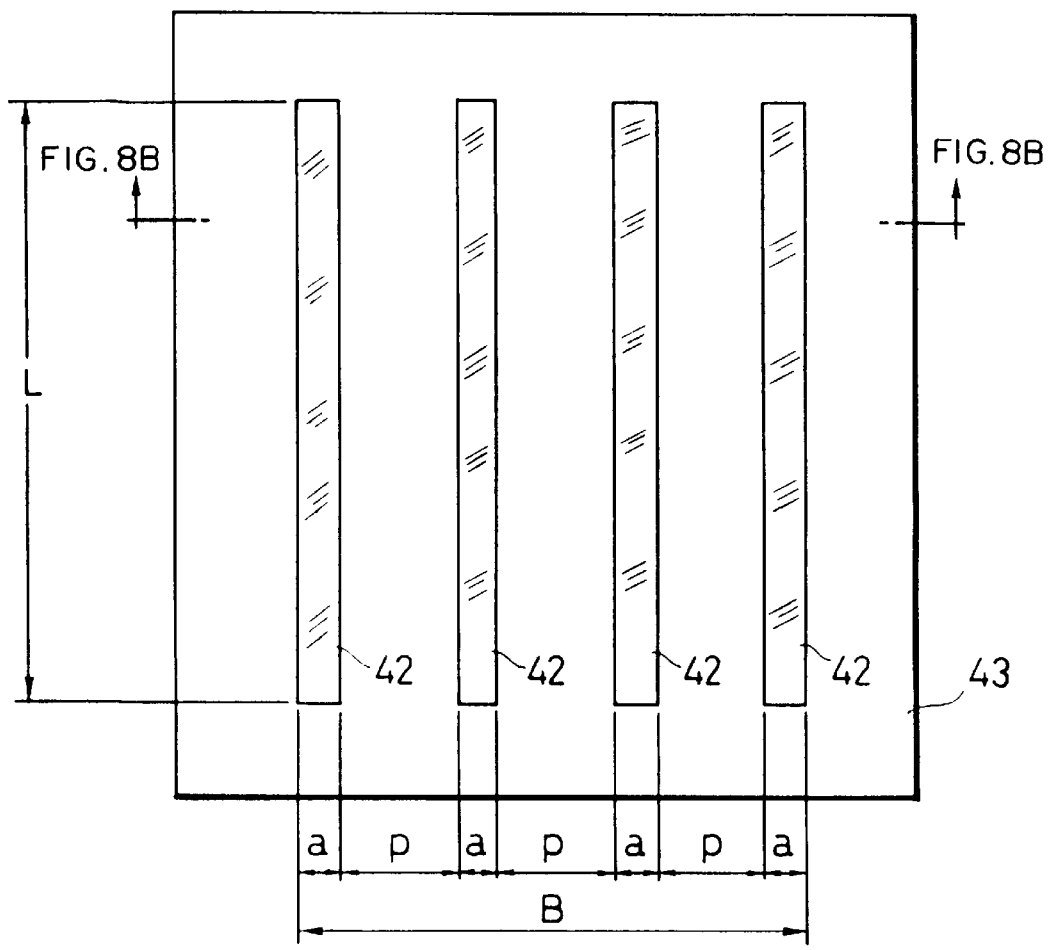
FIGS. 8(a) and 8(b) respectively show an example where wiring is provided on a semiconductor substrate.
Figure 8B:
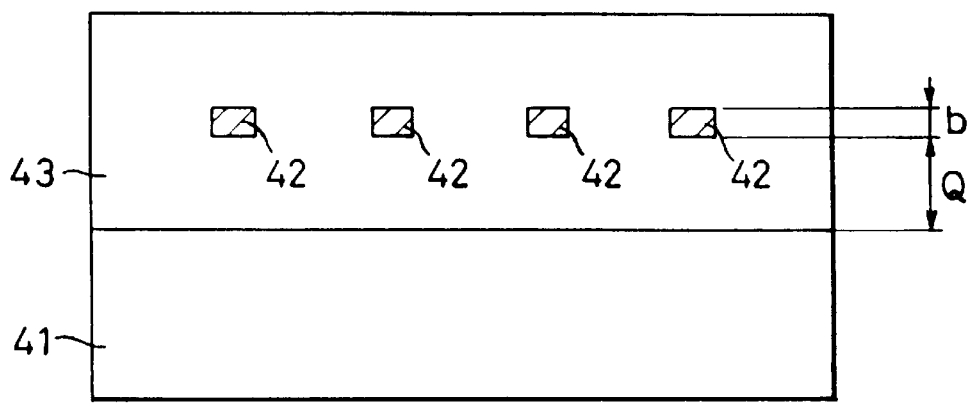

FIG. 8(a) shows a group of wiring lines 42 mounted in an insulating layer 43 formed on a semiconductor substrate 41, and FIG. 8(b) is a cross section taken along the line A-A' of FIG. 8(a).

In FIGS. 8(a) and 8(b), the semiconductor substrate 42 consists of silicon. However, this substrate 42 may be formed with GaAs, Ge or the like. Further, the insulating layer 43 may be formed with $SiO_2$ on the substrate 41 in thickness of Q.

Moreover, a plurality of wiring lines 42 consisting of Al are formed on the insulating layer 43. Besides, another insulating layer is formed on the insulating layer 43 to embed the wiring lines 42 therein. In this case, the wiring lines 42 each having a length L, a width A and a thickness b are arranged at an interval of P, and the total number thereof is N. Moreover, the thickness of the insulating layer 43 is Q, and the dielectric constant is $\epsilon_1$.

In such a construction, the capacitance between the wiring lines 42 and the substrate 41, i.e., the line-to-substrate capacitance Ce, can be obtained by the following expression (i):

$$Ce = (A \cdot L \cdot N) \cdot \epsilon_1 / Q \qquad \text{(i)}$$

While, the capacitance between the wiring lines 42, i.e., the line-to-line capacitance Ci, can be expressed as follows:

$$Ci = bL(N-1) \cdot \epsilon_1 / P \qquad \text{(ii)}$$

As shown in FIG. 8(a), the total width of these wiring lines 42 is obtained as follows:

$$B = (N-1)P + A \cdot N \qquad \text{(iii)}$$

Accordingly, if the wiring-line number N is sufficiently large, the following expression can be established.

$$B = N(P+A), \text{ or } N = B/P+A$$

In this case, Ce and Ci are changed into the following expressions (iv) and (v) respectively.

$$Ce = (L \cdot B \cdot \epsilon_1) \cdot (1/Q) \cdot (A/(P+A)) \qquad \text{(iv)}$$

$$Ci = (L \cdot B \cdot \epsilon_1) \cdot (1/P) \cdot (b/(P+A)) \qquad \text{(v)}$$

Incidentally, in order to increase the integration density of the semiconductor, it is necessary to reduce the wiring width A and wiring interval P. Therefore, in this case, both wiring width A and wiring interval P are reduced with keeping the ratio between them constant.

As is seen from the expression (iv), if both A and P are reduced under such a condition, the line-to-substrate capacitance Ce is not changed when Q is constant. However, the line-to-line capacitance Ci is increased in proportion to $1/(P^2)$.

Therefore, it is necessary to set a certain limit value in reducing the wiring interval P. Moreover, as shown in the expression (v), the line-to-line capacitance Ci is changed in proportion to the wiring thickness b. Therefore, in order to suppress the increasing ratio of Ci to about I/P, it is necessary to reduce the thickness b in proportion to both A and P.

Figure 9:
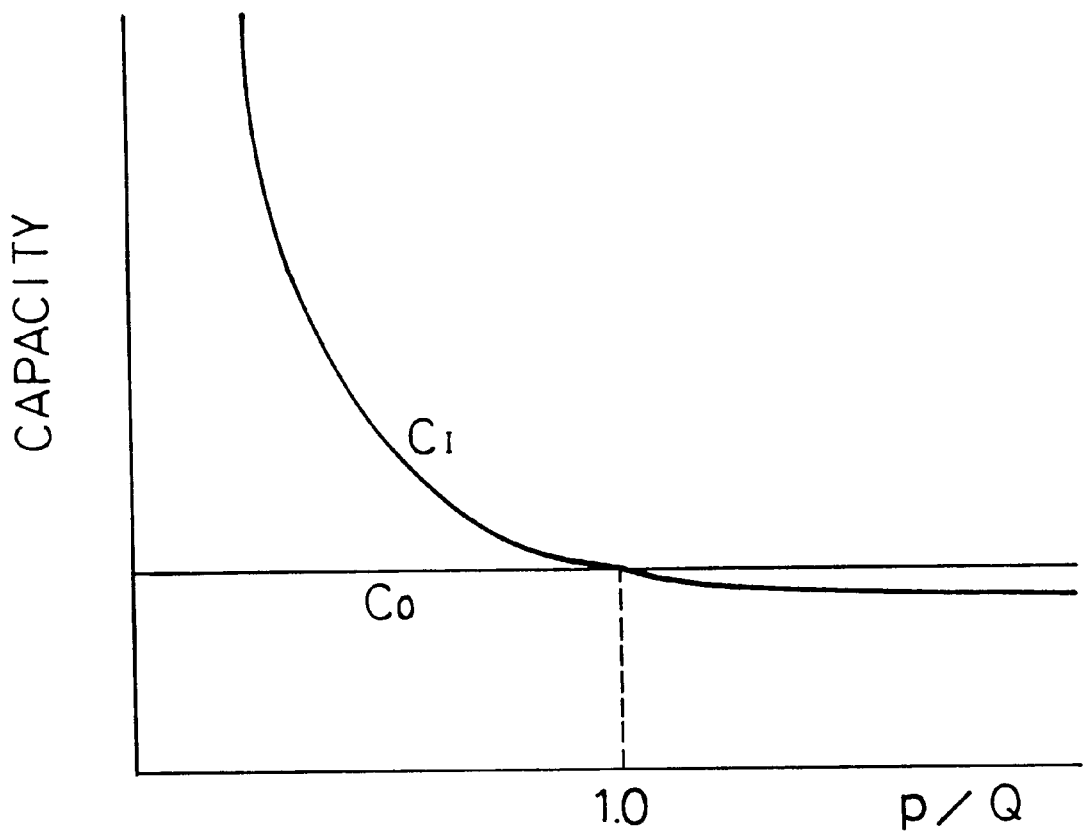
FIG. 9 shows a relation between P/Q, Ci and Co.

FIG. 9 shows a relation between Ce and Ci where A is equal to b and the ratio between a and P is constant. In the same drawing, the vertical axis shows capacitance, and the horizontal axis shows the ratio between P and Q.

As seen from FIG. 9, Ci is rapidly increased with reduction of P in the range of P<Q.

This apparently shows the fact that Ci is increased in proportion to $1/(P^2)$.

Namely, the aim of this embodiment is to control the wiring interval P in order to enhance the cooling effect. However, it is inevitable to reduce the wiring width A for increasing the integration degree of the semiconductor devices. Therefore, the influence of P to be on the wiring capacitance is suppressed by setting P at least twice the value of A. Then, the recommendable value A and P satisfies the following relation:

$$2 \cdot A \leq P \leq Q.$$

Hereinafter, an example of LSI's where the wiring width A is 0.2 μm is described.

In this case, P and Q are both 1.0 μm, and the total wiring capacitance is now designated by C. While, in case of another LSI which is constructed by a conventional shrink design method, both values P' and A' become 0.2 μm, Q becomes 1.0 μm, and the total wiring capacitance is designated by C'.

Generally, the total wiring capacitance per unit area is mainly dependent on the line-to-line capacitance Ci. Therefore, the ratio of C/C' can be expressed as follows:

$$P'(P'+A')/P(P+A) = 0.2(0.2+0.1)/1.0(1.0+0.2) = 1/15$$

Accordingly, the power consumption of the LSI according to this embodiment can be reduced to about 1/15 as compared with the power consumption Pw' of an element constructed by the conventional technique.

Namely, according to this embodiment, the power consumption of semiconductor devices can be effectively reduced by suitably reducing the wiring interval.

Described below is another embodiment according to the present invention for processing a plurality of chips by using light-emitting elements and light-receiving elements.

Figure 10A:
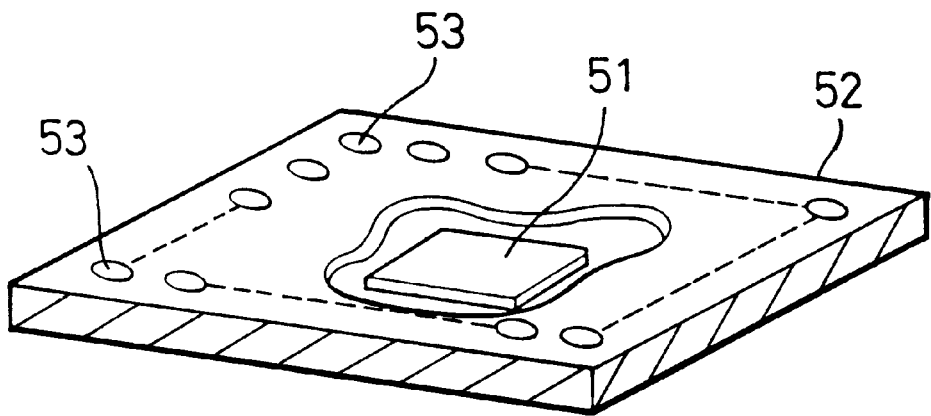
FIGS. 10(a) to 10(d) respectively show an example where optical elements are provided in a package of a semiconductor chip, and shows an example of the semiconductor chip.
Figure 10B:
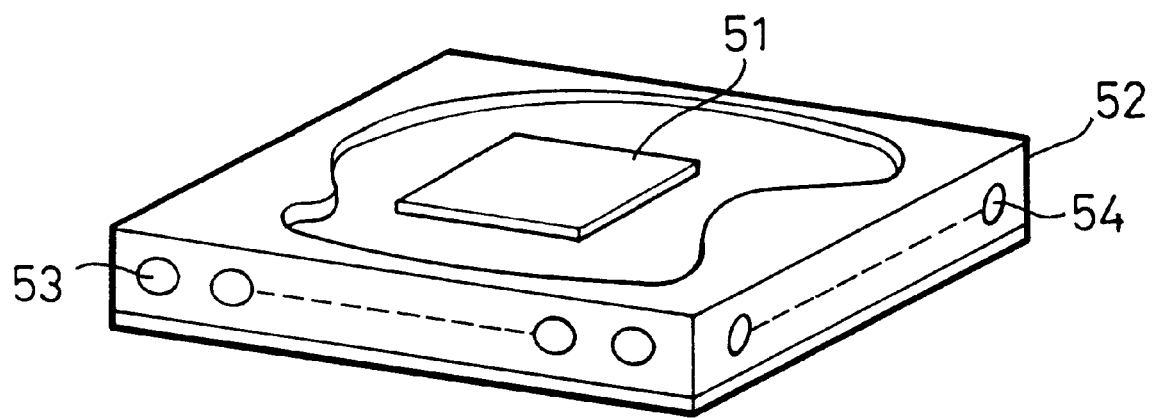
Figure 10C:
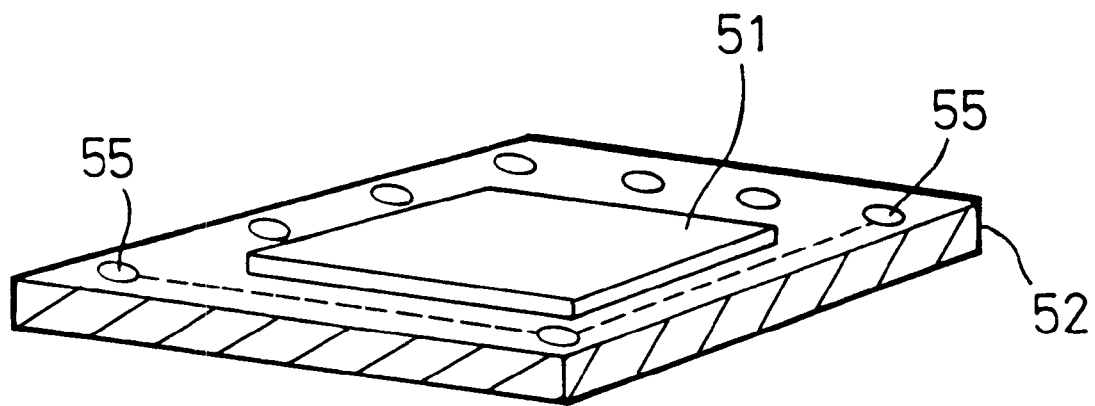
Figure 10D:

FIGS. 10(a) to 10(c) respectively show packages for a semiconductor chip, each being provided with light-emitting and light receiving elements. Moreover, FIG. 10(d) shows an example of the chip.

More specifically, FIG. 10(a) shows a package 52 in which an LSI chip 51 is placed at the central portion thereof. Namely, FIG. 10(a) gives a partly broken diagram to show the position of the chip 51. The package 52 consists of ceramics, however, it may be formed with other materials such as plastics.

Moreover, a plurality of optical elements are respectively embedded in the package 52, for example, the light-emitting elements being exposed from the main surface (front surface) of the package 52 and the light-receiving elements being exposed from the rear surface thereof.

Of course, there is no difference if these two kinds of elements are so arranged as to be exposed from the reverse surfaces respectively.

Moreover, these light-emitting and light-receiving elements may be exposed from these surfaces alternately. Incidentally, these elements are connected to a circuit incorporated in the chip by conventional electrical and mechanical connection methods. This package 52 is about 2 to 5 cm square.

FIG. 10(b) shows an example in which the optical elements are exposed from the four side surfaces of the package 52. In this case, each optical element is, for example, a light-emitting element, a light receiving element or a photo coupler.

FIG. 10(c) shows an example in which these elements are embedded in the package 52 so as to be exposed only from the rear surface thereof. As in the case shown in FIG. 10(b), each optical element is a light-emitting element, a light-receiving element or a photo coupler.

FIG. 10(d) shows construction of the semiconductor chip 51 used in this embodiment. In this example of FIG. 10(d), the chip consists of a silicon (Si) semiconductor substrate partly including gallium-arsenic (GaAs). Moreover, it is also possible to use substrates each consisting of only a single material such as Si, Ge, GaAs, InP.

Figure 11:
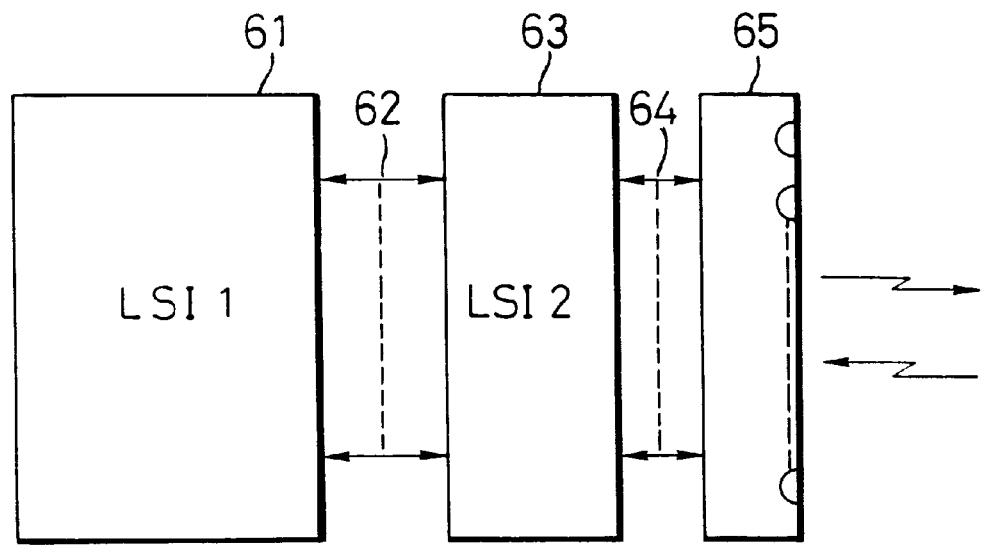
FIG. 11 shows another example where optical elements are provided in a package of a semiconductor chip.

FIG. 11 shows construction of a semiconductor device where the above-mentioned chips and the optical elements are actually used.

In the same drawing, a chip 61 is a processor comprising a CPU and memories or a parallel processor comprising a plurality of CPU's, a chip 63 includes a high-speed series-parallel conversion circuit, and a chip 65 is an optical-element-type chip comprising light-emitting and light-receiving elements.

Further, connecting wiring 62 and 64 are respectively provided for transmitting signals between chips 61 and 63 and between chips 63 and 65. The chip 61 consists of Si or GaAs. The chip 63 contains a series-parallel conversion circuit for which extremely high-speed and high-performance operation should be required, and comprises a GaAs device or a Si substrate on which an ECL (Electronic Coupling Logic) circuit is provided. The connecting wiring 62 comprises 500 signal lines to transmit clock signals of 200 MHz respectively.

The serial input-output rate of each line in the connecting wiring 64 is 1.5 to 5 Gbits/sec, and this value corresponds to an ultra-high speed. For example, if 50 signal transmission lines are used at the rate of 2 Gbits/sec, the total rate becomes 100 Gbits/sec.

The chip 65 is the most important element of this construction, which is an optical element system comprising a plurality of light-emitting elements and light-receiving elements and is connected to the chip 63 through the connecting section 64.

Though this embodiment uses these two chips 61 and 63 separately, it is possible to combine them into one chip if the device on the silicon substrate is operated at high speed at the level of several picoseconds ($10^{-12}$ sec) by circuit design of the ECL and the like circuit portions, or if the integration density of the permissive elements on the GaAs site becomes more than several hundreds of thousands of transistors. Moreover, the chip as shown in FIG. 10(d) may be used as such a combination chip comprising the two chips 61 and 63.

Figure 12:
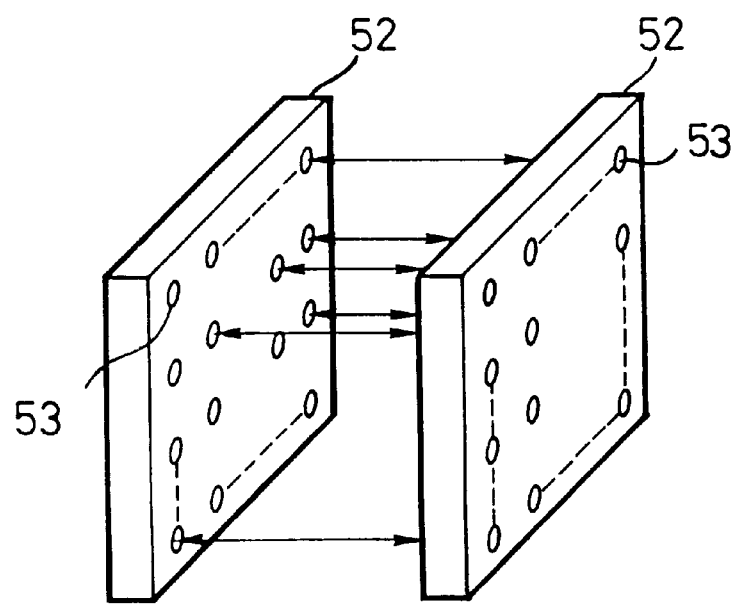
FIG. 12 shows an example of a photo-connection between two packages provided in parallel.

FIG. 12 shows a semiconductor device in which two packaged chips both to be used, for example, as CPU's are optically connected. As shown in this drawing, the semiconductor device comprises two opposing chips in parallel so that the light-emitting side and the light-receiving side of each package 52 including each chip face each other.

In this embodiment, the chip shown in FIG. 10(a) is used as these two chips, therefore both optical elements are exposed from both front and rear sides of each package 52 respectively. Namely, the communication between these two chips can be accomplished by light transmission in the vertical direction to the front or rear side of each package 52.

In this case, the system must be so constructed that the light axes of each pair of light-emitting and light-receiving elements become one axis, moreover, wiring lines, such as control lines and power source lines, and other circuit parts do not cross the light transmission area.

To make the respective light axes of these opposing optical elements the same, it is necessary to provide a suitable physical guide on each optical path or arrange a spacer for deciding a correct optical relation between these elements.

Figure 13:
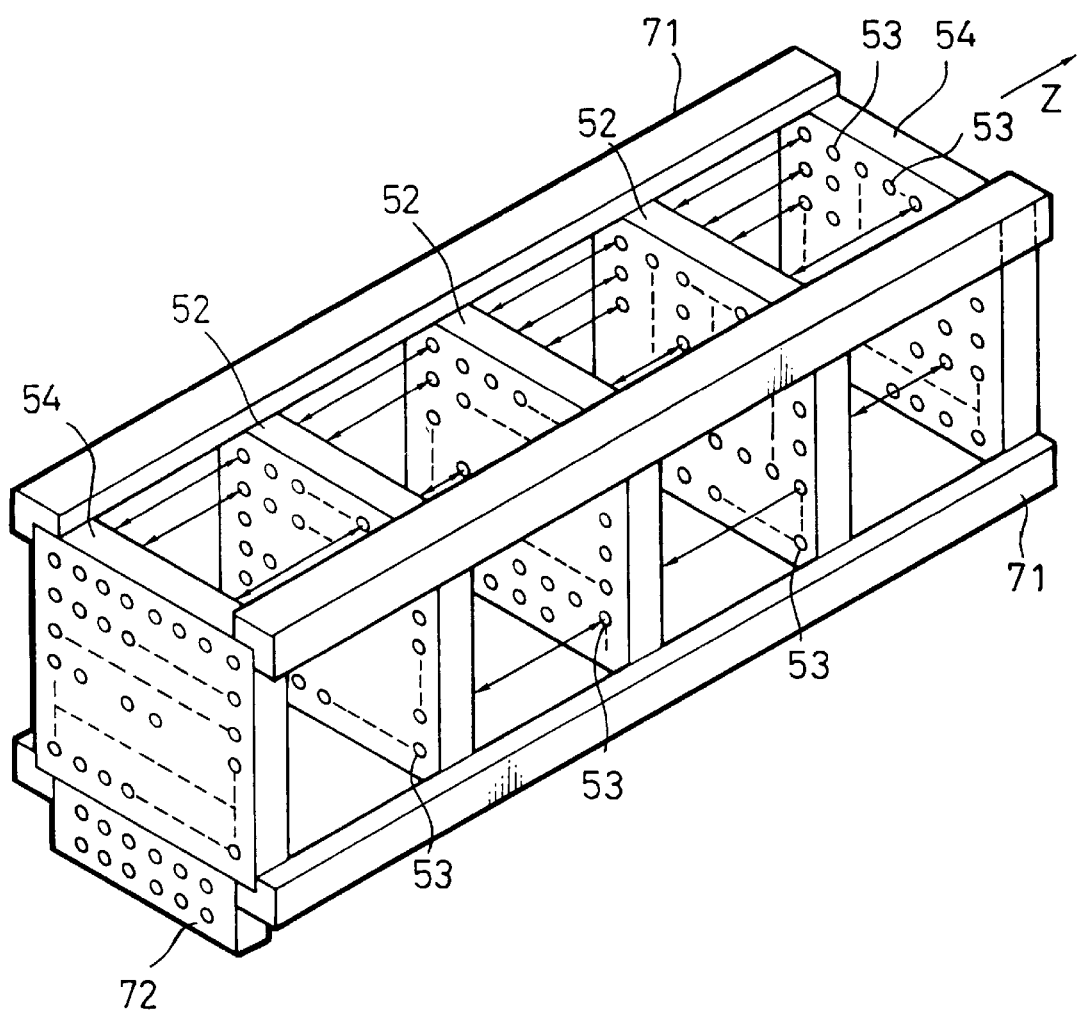
FIG. 13 shows another example of a photo-connection in a plurality of packages.

Next, another embodiment of the cooling device is described. FIG. 13 shows an example of a system in which several to several hundreds packaged chips are opposed to one another in the same manner as in the above embodiment shown in FIG. 12, and these opposed chips are so fixed with guide frame so as to make a tubular body. In this case, it is not necessary to make constant the respective intervals between these chips, and it is preferred that the interval is set within the range of about 1 to 5 cm.

Namely, these chips are correctly positioned and piled respectively in suitable spaces in the direction designated by the arrow Z with a metal guide frame 71 and stoppers (not shown) formed on the frame 71.

Figure 14:
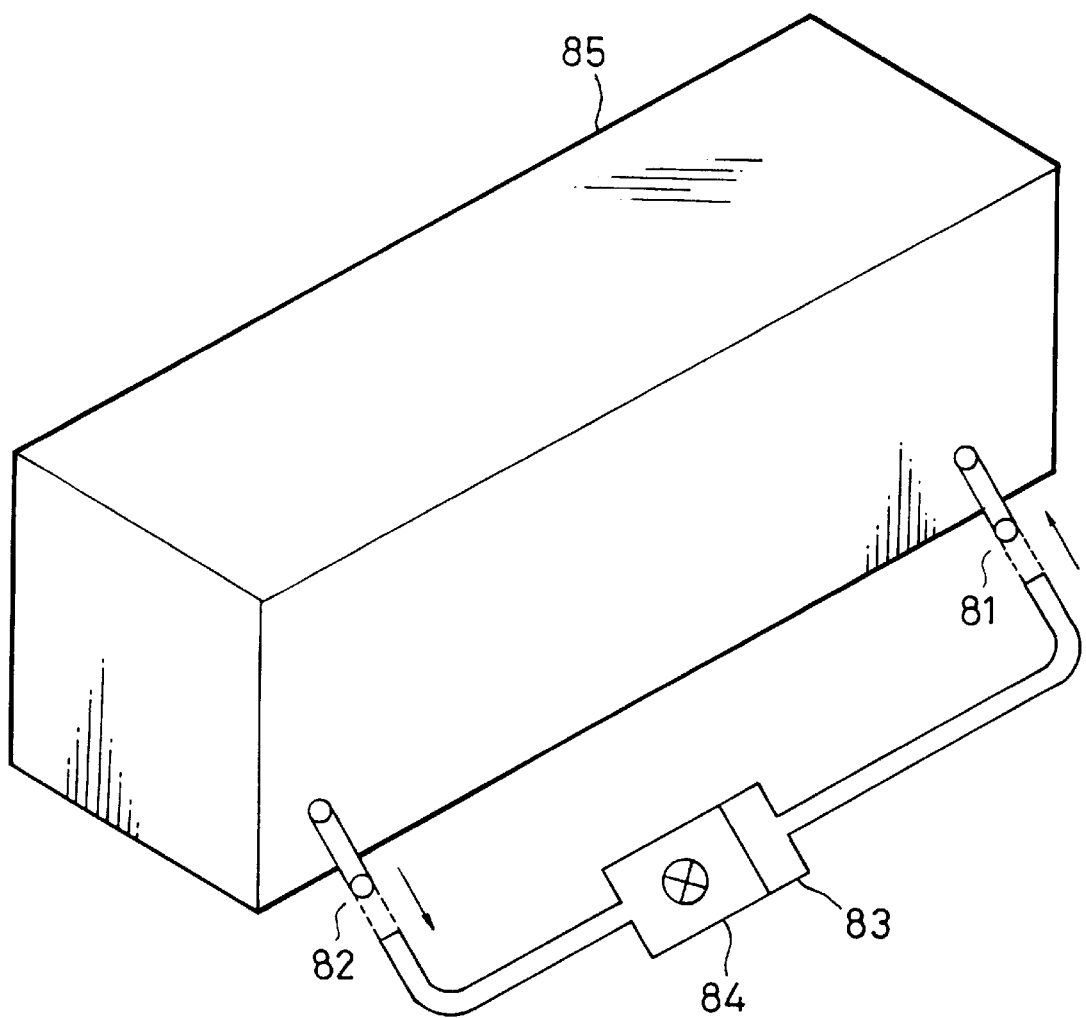
FIG. 14 shows an example of a cooling device constructed with an outer cover.

Moreover, a tubular body to be formed by the guide frame 71 respectively fixing chip packages 52 at the corners thereof is covered with an outer cover 85 as shown in FIG. 14. The tubular cover 85 is used for cooling the chip assembly, and consists of a material such as Al, Cu. The packages positioned at both ends of the guide frame 71 are so arranged that the light-emitting and light-receiving elements for optical connection to external circuits can be exposed from these edge.

Moreover, a cooling box is hermetically constructed with the packages 53, 54 at both ends of the chip assembly and the cover 71, so that the inside of the box is cooled with a suitable cooling medium. Incidentally, an input-output connector 72 is attached to the outer packages 54.

As shown in FIG. 14, the cooling box has an inlet 81 and an outlet 82 for receiving and discharging a cooling fluid such as water. The inlet 81 and outlet 82 are communicate with each other through a pipe which is connected to a cooler 83 and a circulating pump 84. Therefore, the inside of the cooling box is cooled by circulation of the cooling fluid. Of course, it is necessary to take care of scattering of the optical axes to be caused by dust or bubbles of the cooling fluid.

However, the clean fluid can be sufficiently guaranteed by using pure water or grease usually used for the related industry. Particularly, bubbles to be generated when the cooling fluid is boiled must be avoided.

Figure 15:
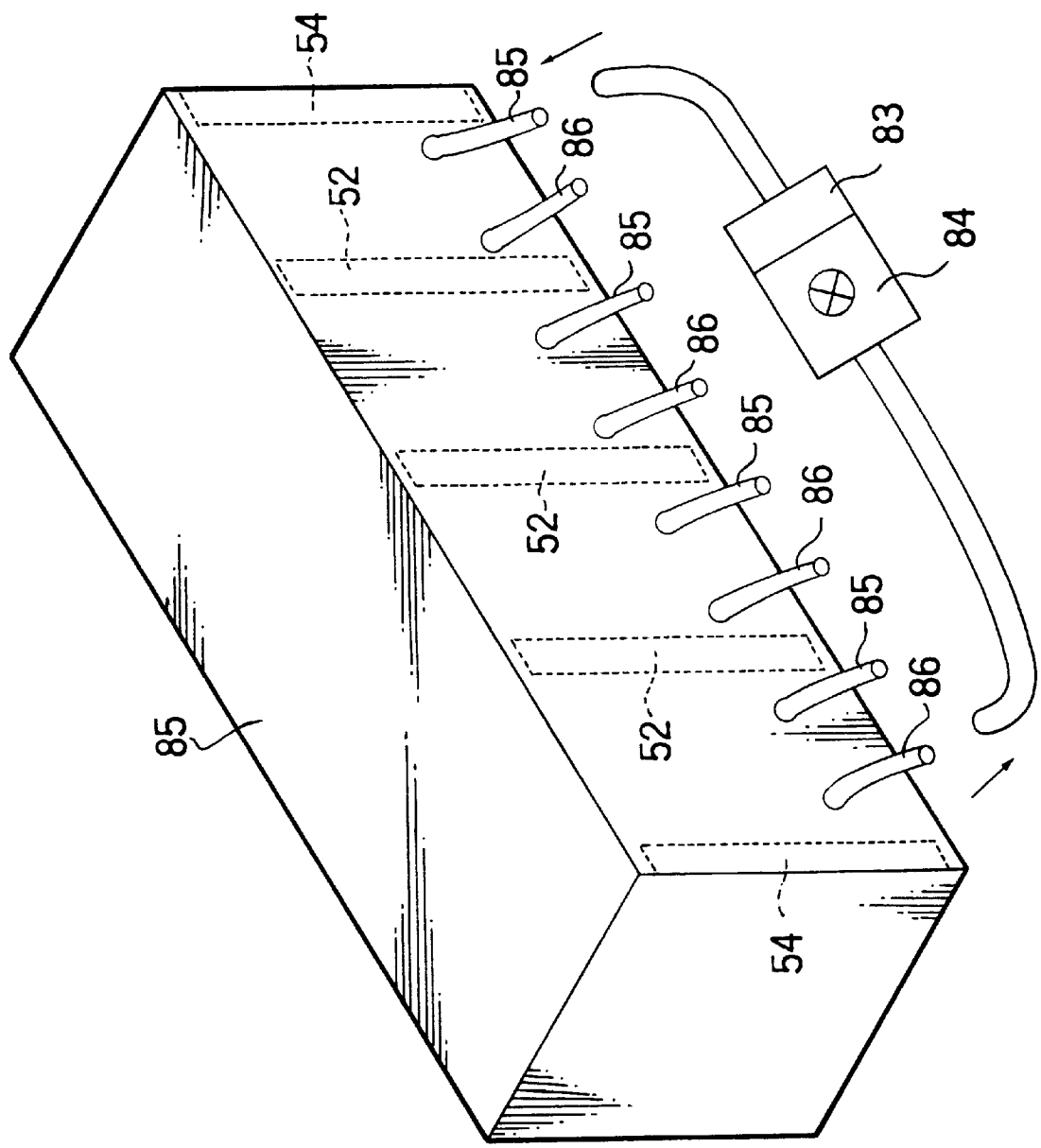
FIG. 15 shows an example where another cooling device is used for enhancing the cooling effect.

Namely, according to this embodiment, since an optical system is adopted for communication between semiconductor chips, it becomes possible to positively cool these chips by a cooling medium, such as water or other fluids. Moreover, since the cooling is positively carried out, the cooling effect is far enhanced as compared with other cooling methods. Therefore, it becomes possible to control the operation temperature of semiconductor devices. Next, still another example of the cooling device according to the present invention is described. FIG. 15 shows a modification of the cooling box given by the embodiment shown in FIG. 14.

According to the embodiment shown in FIG. 15, the cooling effect of the semiconductor device is further improved as compared with the case shown in FIG. 14.

Namely, in this embodiment, an inlet 85 and an outlet 86 (corresponding to 81, 82 in FIG. 14) are given to the space between each pair of adjacent chips. Therefore, the cooling effect to be obtained by circulating a cooling fluid in the cooling box can be markedly enhanced.

Described below is another embodiment of the semiconductor device according to the present invention which comprises arranging chips 91 each including light-emitting and light-receiving elements and cooling units 92 alternately.

Figure 16A:
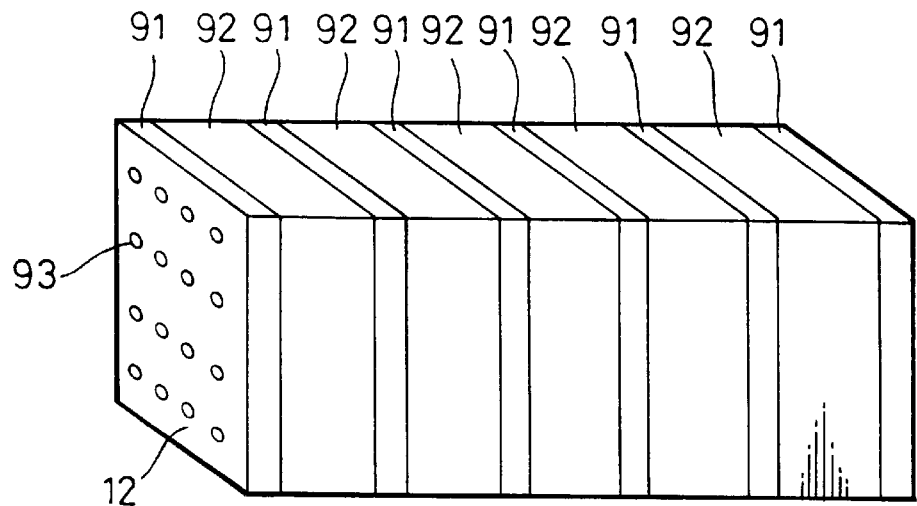
FIGS. 16(a) and 16(b) show an example where chip packages and cooling units are arranged alternately to enhance the cooling effect.

In a chip assembly shown in FIG. 16(a), each chip 91 has light-emitting or light-receiving elements 93 at predetermined positions (16 positions in the same drawing) respectively. If some units with no light-emitting and light-receiving elements are inserted in the chip assembly, these units are provided with some light guide means to guarantee the light transmission through the whole assembly body. As the light guide means, it is possible to use an optical fiber or hole whose side is parallel to the optical path being metallized.

Figure 16B:
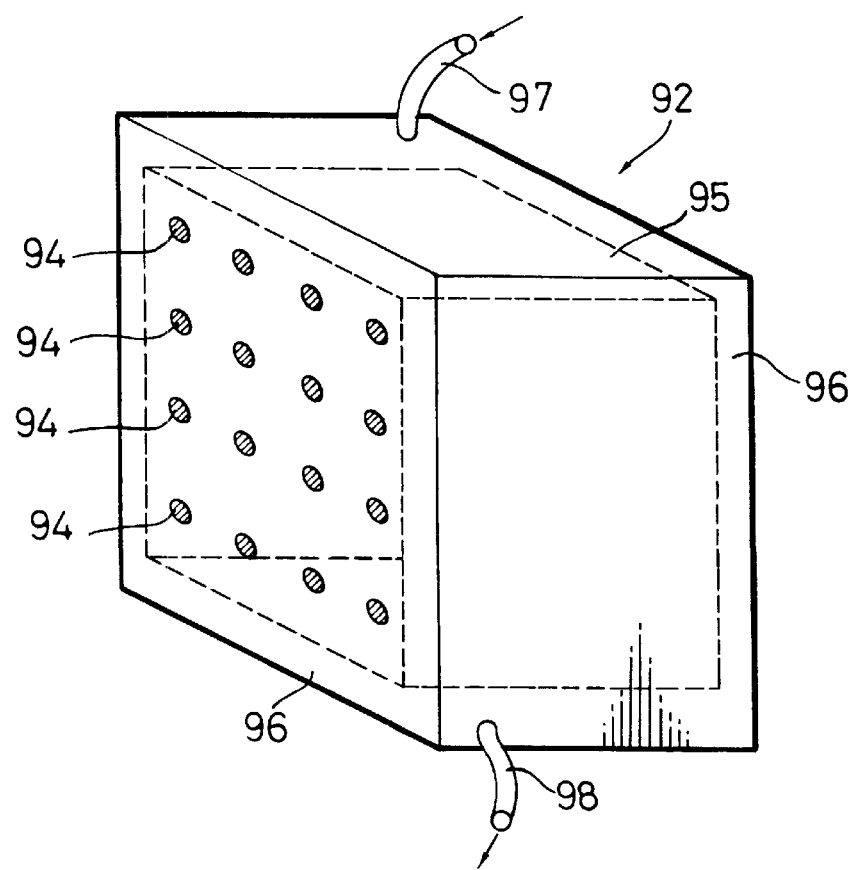

FIG. 16(b) shows the cooling unit 92 in detail. The unit 92 consists of a material with good heat conductivity, such as Al. Moreover, each unit 92 is closely attached to the surface of each adjacent chip 91 so as to effectively cool it. As mentioned above, the cooling unit 92 has light guides 94 correctly corresponding to the respective optical axes decided by the positions (16 positions designated in FIG. 16a) of the optical elements 93 included in the adjacent chip 91.

Therefore, it is possible to transmit light from each light-emitting element of a chip to a corresponding light-receiving element of another chip through a light guide 94 of a cooling unit 92 and a guide 93 of a chip 91 without scattering the light or losing the light energy so much.

Moreover, to increase the cooling effect, a single or plural cooling chambers 95 may be provided on the outside of the cooling units 92 so as to cool the units 92 by some cooling medium. For example, as partly shown in FIG. 16(b), it is possible to circulate a cooling fluid such as freon in the chamber 95 from an inlet 97 to an outlet 98 thereof.

As mentioned above, according to this embodiment, it becomes possible to effectively enhance the cooling effect on the semiconductor operation with preventing the scattering and damping of light to be transmitted between optical elements for the communication of chips in the semiconductor device.

Incidentally, if chips as shown in FIG. 10(b) having the optical elements in the four side faces thereof are arranged in the plane direction thereof, and cooling units as mentioned above are respectively interposed between them, the light guides in each unit are formed so as to correspond to the respective light transmission axes between these chips.

Next, an embodiment in which the chips as shown in FIG. 10(b) are arranged in the plane direction on the substrate is described with reference to FIGS. 17(a) to 17(c).

As shown in these drawings, a chip 102 is placed at a predetermined position in parallel on the surface of a substrate 101 on which power source lines (Vcc) and ground lines (GND) are respectively formed. On the substrate 101, a second chip 103 is also placed next to the chip 102 so that the optical elements 104 provided in both chips 102, 103 correspond to one another respectively. In such a manner, four chips are arranged to the four side faces of one chip on the substrate 101.

Figure 17A:
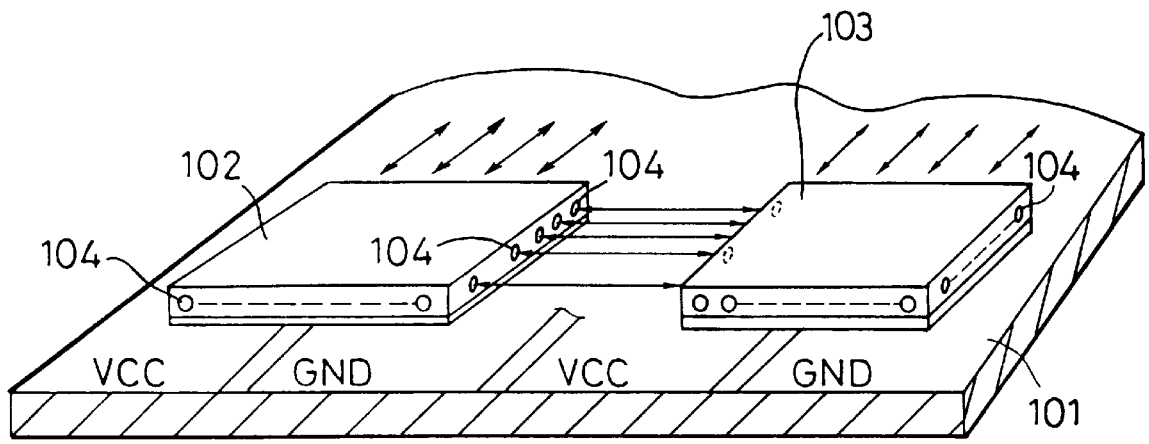
FIGS. 17(a) to 17(c) respectively show an example of a photo-connection in a package which is provided with optical elements on the side surface thereof.
Figure 17B:
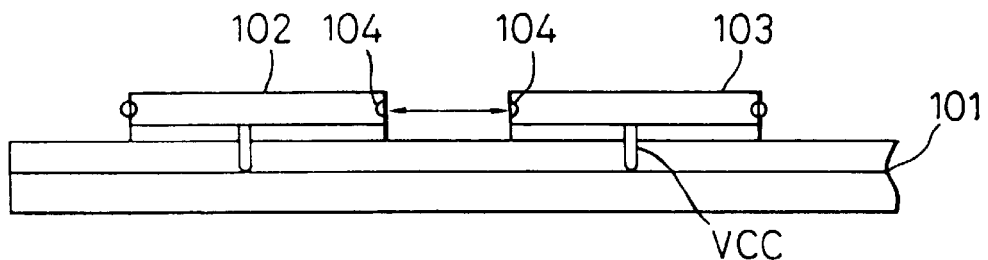

FIG. 17(b) shows a cross section of the semiconductor device shown in FIG. 17(a).

Figure 17C:
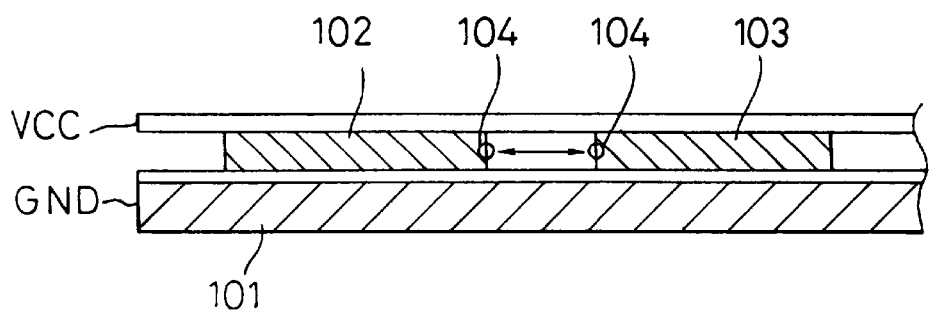

Incidentally, FIG. 17(c) shows another example where the chip packages 102, 103 are interposed between two metal plates respectively used as the Vcc and GND lines on the substrate 101. Because these metal plates can also be used as a heat-discharging material, it is advantageous in cooling the semiconductor device to adopt this construction.

Accordingly, if these chip packages are further provided with materials having large heat conductivity in the bottom or top side thereof, the cooling effect can be more improved.

Next, an embodiment in which the chips as shown in FIG. 10(c) are arranged in the plane direction on the substrate is described with reference to FIGS. 18(a) to 18(c). Namely, each chip shown in FIGS. 18(a) to 18(c) has optical elements only in the bottom side thereof.

In the same drawings, reference numeral 111 is a substrate, 112, 113, 114 respectively show chip packages, and 116 shows an optical element.

In case of the optical communication, the light emitted from one optical element 116 of a chip (for example 112) is transmitted to another optical element 116 of another chip (for example 113) not through a free space as described in the case shown in FIGS. 17(a) to 17(c) but through a light guide tube 115 which is formed with Al or the like material in the surface of the substrate 111.

Figure 18A:
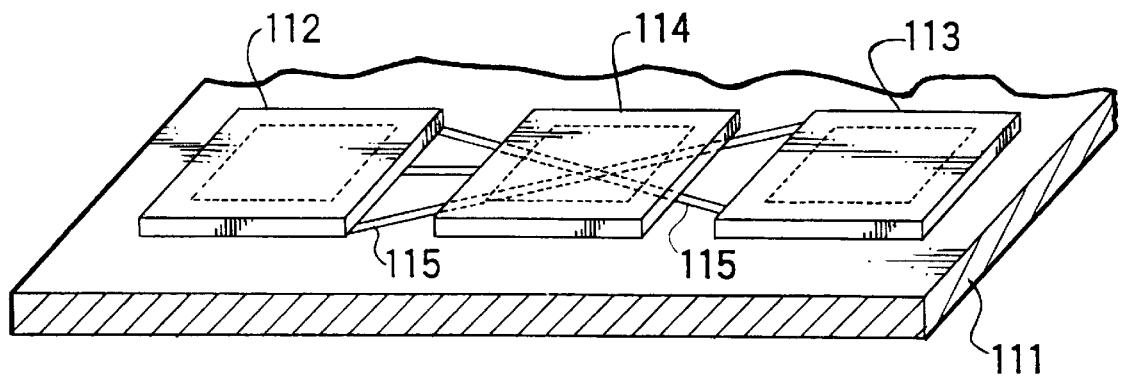
FIGS. 18(a) to 18(c) respectively show an example of a photo-connection in a package which is provided with optical elements on the rear surface thereof.
Figure 18B:
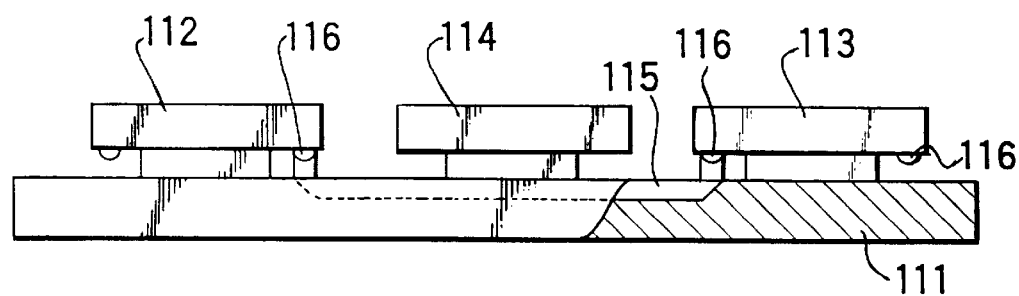
Figure 18C:
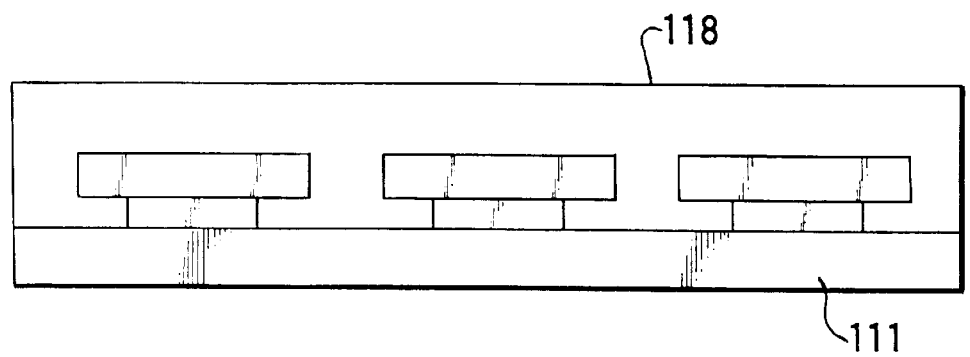

In this case, if still another chip (for example 114) is existent between these chip packages 112, 113 as shown in FIGS. 18(a) to 18(c), the optical communication can be executed below the chip 114.

Moreover, it is also possible to enhance the cooling effect of the semiconductor device by providing a cover 118 consisting of a material with good heat conductivity, such as Al and Cu, as shown in FIG. 18(c). In this case, each optical path is so defined that light is emitted from a light-emitting element vertically down to the substrate, and is then horizontally transmitted along the surface of the substrate through the light guide tube, and then thereafter travels vertically from the surface of the substrate up to a corresponding light-receiving element.

Therefore, according to the chip arrangement of this embodiment utilizing the optical communication as described above, it becomes possible to easily divide a plurality of chip packages into some suitable blocks. Moreover, both power consumption and the cooling effect of the semiconductor device can be effectively improved.

Various modifications will become possible for those skilled in the art after receiving the teachings of the present disclosure without departing from the scope thereof.

What is claimed is:

1. A semiconductor device comprising:
   a semiconductor-element substrate;
   an insulating layer formed on the semiconductor-element substrate; and wiring lines embedded in the insulating layer, where a distance Q between the wiring lines and the substrate is less than or equal to 1.0 μm, and where a distance P between the wiring lines is substantially equal to the distance Q between the wiring lines and the substrate and a width A of the wiring lines is less than or equal to ½ of the distance P between the wiring lines, and wherein a thickness B of the wiring lines is less than or equal to the width A.

* * * * *